US012193208B2

(12) United States Patent
Shreeram et al.

(10) Patent No.: US 12,193,208 B2
(45) Date of Patent: Jan. 7, 2025

(54) CAPACITORS WITH ELECTRODES HAVING A PORTION OF MATERIAL REMOVED, AND RELATED SEMICONDUCTOR DEVICES, SYSTEMS, AND METHODS

(71) Applicant: Micron Technology, Inc., Boise, ID (US)

(72) Inventors: Devesh Dadhich Shreeram, Boise, ID (US); Kangle Li, Boise, ID (US); Matthew N. Rocklein, Boise, ID (US); Wei Ching Huang, Central Taichung (TW); Ping-Cheng Hsu, Tokyo (JP); Sevim Korkmaz, Boise, ID (US); Sanjeev Sapra, Boise, ID (US); An-Jen B. Cheng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 226 days.

(21) Appl. No.: 17/647,902

(22) Filed: Jan. 13, 2022

(65) Prior Publication Data

US 2022/0238532 A1 Jul. 28, 2022

Related U.S. Application Data

(60) Provisional application No. 63/139,619, filed on Jan. 20, 2021.

(51) Int. Cl.
*H10B 12/00* (2023.01)

(52) U.S. Cl.
CPC .......... *H10B 12/033* (2023.02); *H10B 12/31* (2023.02)

(58) Field of Classification Search
CPC ......... H01L 28/60; H01L 28/91; H01L 28/92; H01L 28/90; H10B 12/31; H10B 12/033
See application file for complete search history.

(56) References Cited

U.S. PATENT DOCUMENTS 7,247,537 B2 * 7/2007 Park .................. H01L 21/31116 438/254
2005/0001212 A1 * 1/2005 Matsui .............. H01L 21/02271 257/E21.018
2009/0184393 A1 * 7/2009 Chen .................... H10B 12/033 257/532
2021/0036101 A1 * 2/2021 Choi ....................... H01L 28/92
2021/0050409 A1 2/2021 Rocklein et al.
(Continued)

FOREIGN PATENT DOCUMENTS

EP 3772103 A1 * 2/2021 ....... H01L 27/10805
KR 20140055741 A * 5/2014
KR 20210117794 A * 9/2021

*Primary Examiner* — Edward Chin
(74) *Attorney, Agent, or Firm* — TraskBritt

(57) ABSTRACT

A DRAM capacitor may include a first capacitor electrode, a capacitor dielectric adjacent to the first capacitor electrode, and a second capacitor electrode adjacent to the capacitor dielectric. The first capacitor electrode may include a lower portion, an upper portion, and a step transition between the lower portion and the upper portion, a width of the upper portion of the first capacitor electrode at the step transition is less than a width of the lower portion of the first capacitor electrode at the step transition. Semiconductor devices, systems, and methods are also disclosed.

15 Claims, 13 Drawing Sheets

(56) References Cited

U.S. PATENT DOCUMENTS

2023/0200055 A1* 6/2023 Kim ........................ H01L 28/90
257/303
2023/0223429 A1* 7/2023 Zhang .................. H10B 12/315
257/534
2023/0253445 A1* 8/2023 Chae ....................... H01L 28/75
257/213

* cited by examiner

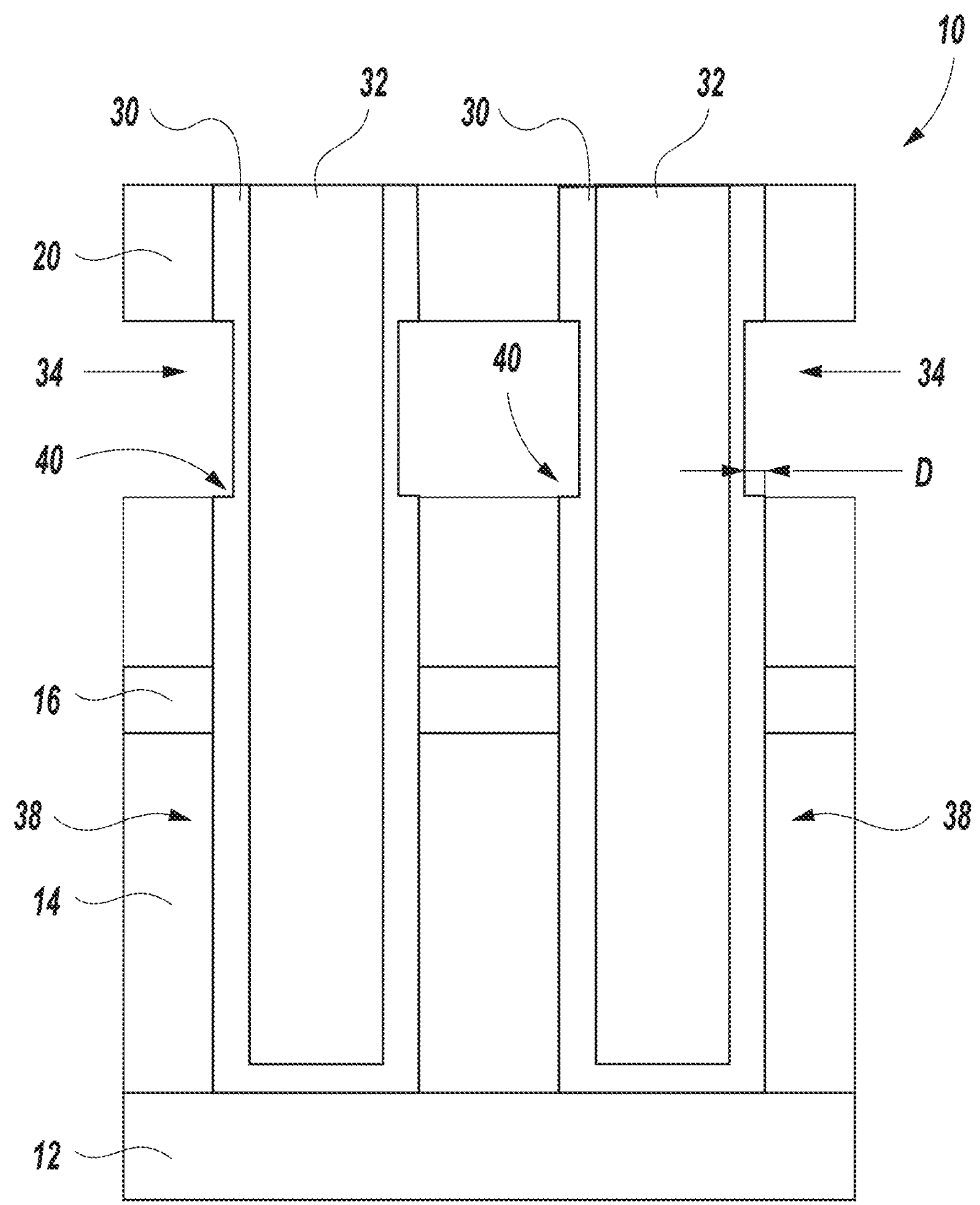
FIG. 4.1

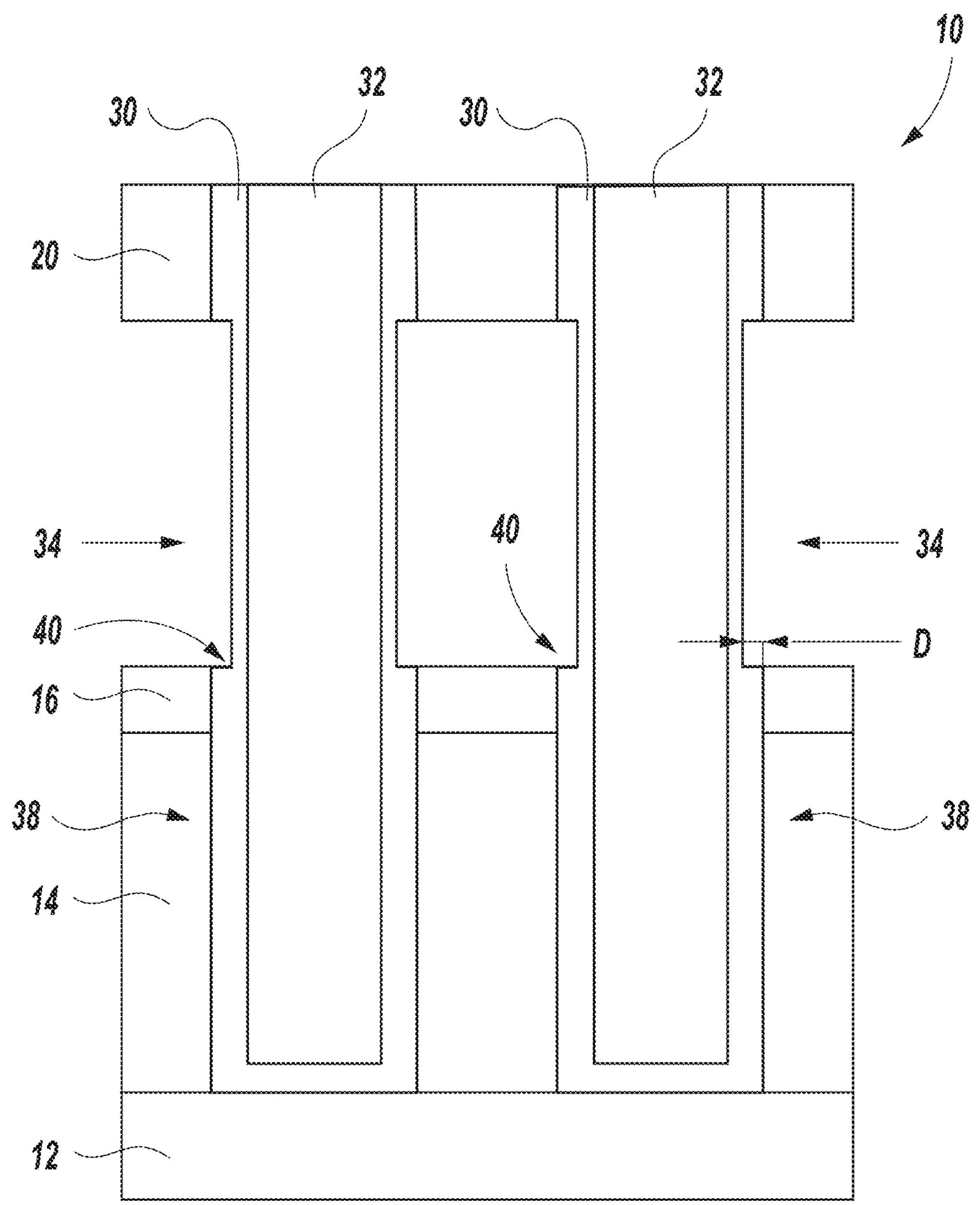
FIG. 4.2

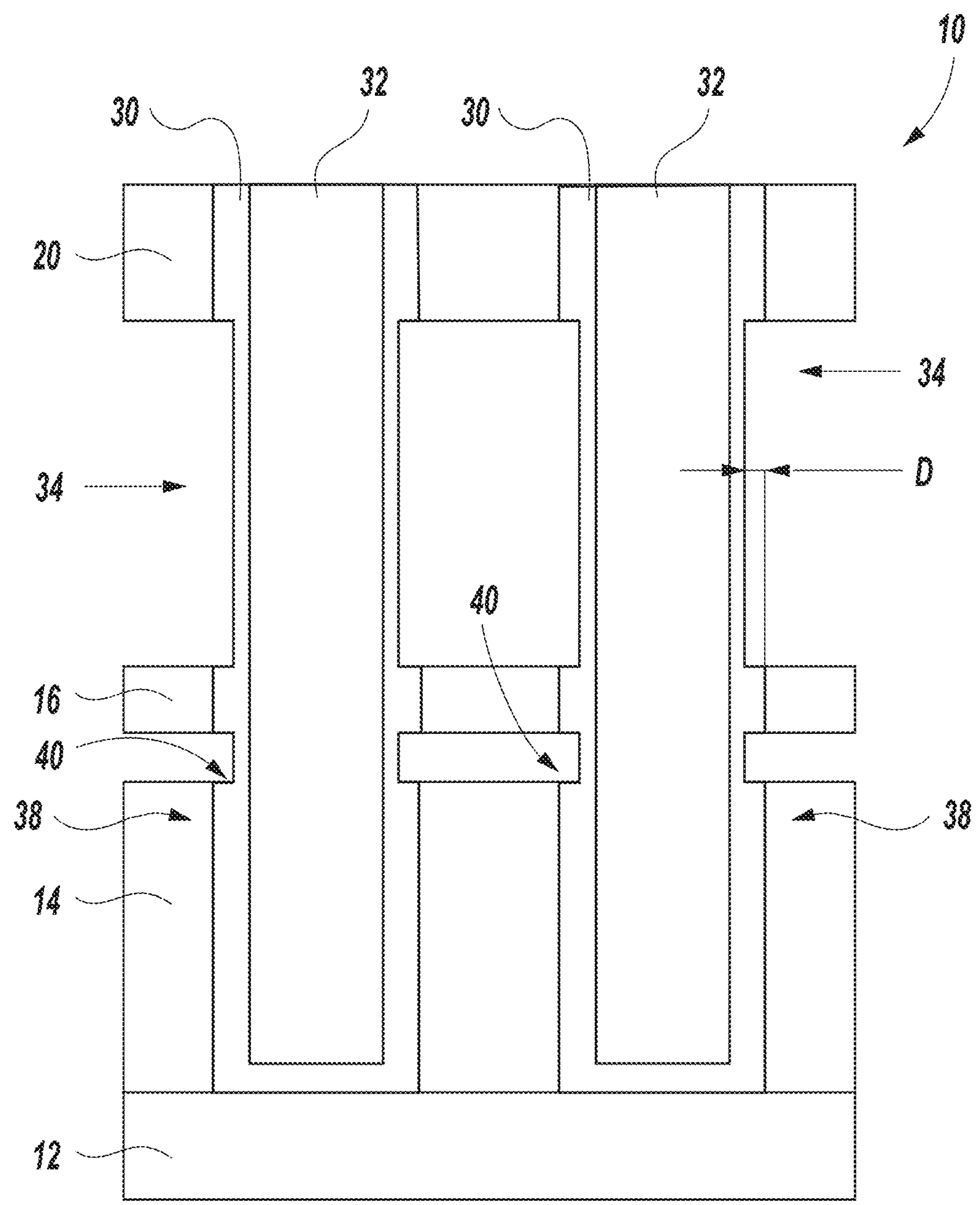
FIG. 4.3

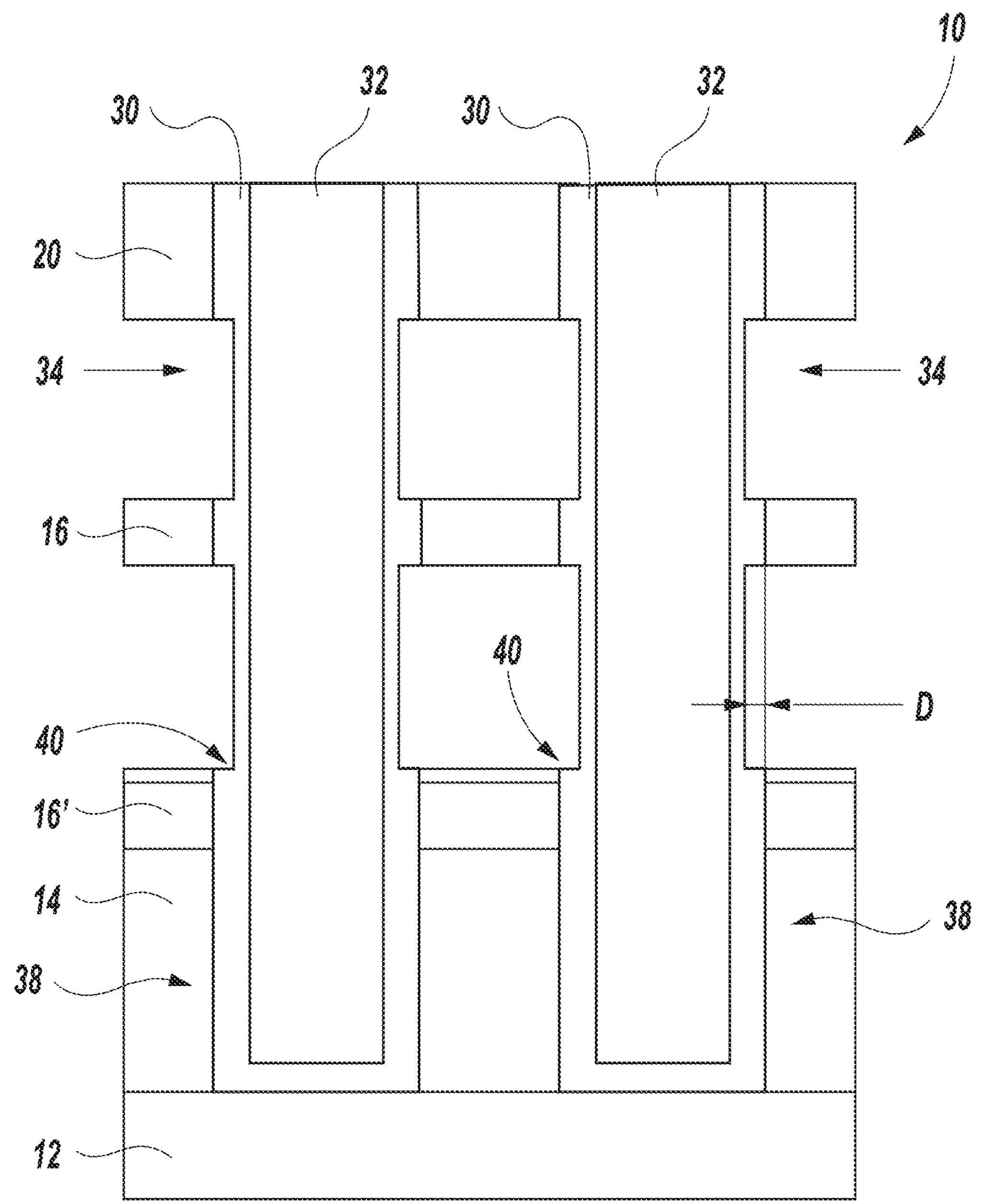
FIG. 4.4

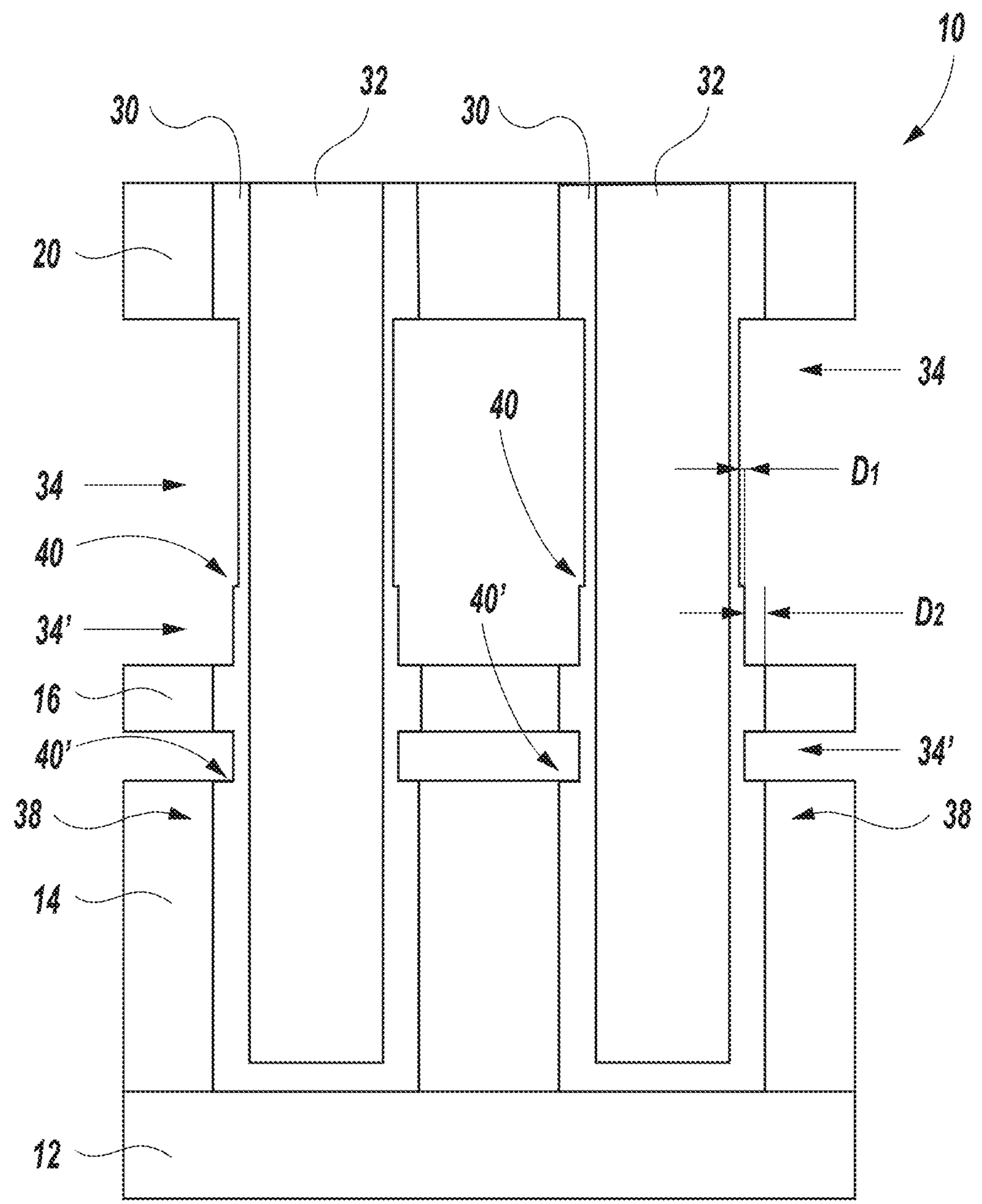
FIG. 4.5

CAPACITORS WITH ELECTRODES HAVING A PORTION OF MATERIAL REMOVED, AND RELATED SEMICONDUCTOR DEVICES, SYSTEMS, AND METHODS

CROSS-REFERENCE TO RELATED APPLICATION

This application claims the benefit under 35 U.S.C. § 119 (e) of U.S. Provisional Patent Application Ser. No. 63/139,619, filed Jan. 20, 2021, the disclosure of which is hereby incorporated herein in its entirety by this reference.

TECHNICAL FIELD

Embodiments disclosed herein relate to semiconductor fabrication including dynamic random-access memory (DRAM) fabrication. More particularly, embodiments of the disclosure relate to electrodes having a portion of material removed used in a DRAM capacitor, to methods of forming the DRAM capacitor and to related semiconductor devices and systems.

BACKGROUND

A continuing goal of integrated circuit fabrication is to increase integration density. Dynamic random-access memory (DRAM) utilizes DRAM capacitors to store an amount of electrical charge that represents the logical value of a stored bit. To increase integration density, the lateral footprint of the DRAM capacitors has been reduced by increasing the aspect ratio (i.e., ratio of height to width or diameter) and decreasing the proximity of adjacent DRAM capacitors to one another. Additionally, to increase the capacitance of a DRAM cell, the height of the DRAM cell may be increased to increase the surface area of the capacitor. The high aspect ratio and smaller lateral dimensions have led to an increase in the occurrence of container under-etch. Attempts have been made to reduce the occurrence of container under-etch by utilizing a dry-etch process. While the dry-etch process may reduce the occurrence of container under-etch, it drastically increases the risk of containers shorting.

DETAILED DESCRIPTION

Figure 1:
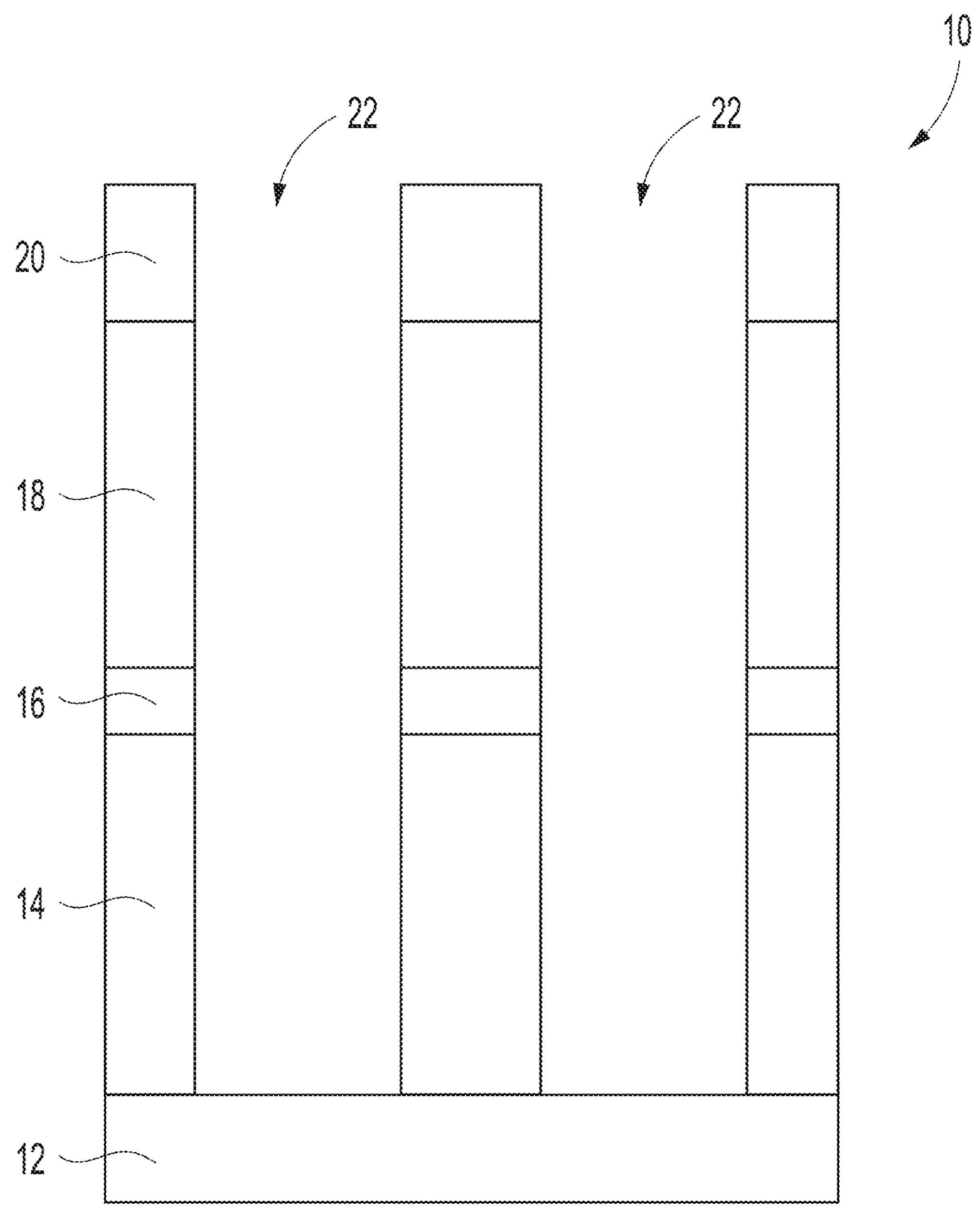
FIGS. 1-6 are schematic, cross-sectional views of a portion of a semiconductor structure in a processing sequence for forming a DRAM capacitor in accordance with some embodiments of the disclosure.

A DRAM capacitor includes a first capacitor electrode (e.g., a bottom capacitor electrode) comprising a lower portion, an upper portion with a portion of material removed, and a step transition between the lower portion and the upper portion. Having material removed from the upper portion provides increased space between the upper portions of adjacent first capacitor electrodes, which may allow the first capacitor electrodes to be positioned closely together while still providing increased space between the first capacitor electrodes. The increased space reduces problems associated with pinching of a capacitor dielectric material formed on the first capacitor electrodes. Additionally, the increased space may reduce problems associated with pinching and/or shorting of the second capacitor electrodes (e.g., top capacitor electrodes) formed on the capacitor dielectric. A DRAM device including the DRAM capacitor is also disclosed, as are methods of forming the DRAM capacitor and systems incorporating DRAM memory.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a complete process flow for manufacturing semiconductor devices and the structures described below do not form a complete semiconductor device. Only those process acts and structures necessary to understand the embodiments described herein are described in detail below. Additional acts to form a complete semiconductor device may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms “a,” “an,” and “the” are intended to include the plural forms as well, unless the context clearly indicates otherwise.

As used herein, the term “about” in reference to a given parameter, property, or condition means and includes to a degree that one of ordinary skill in the art would understand that the given parameter, property, or condition is met with a degree of variance, such as within acceptable manufacturing tolerances.

As used herein, the term “aspect ratio” means and includes a ratio of a height (e.g., length) of a structure such as a DRAM capacitor to a width (e.g., diameter) of the structure. The aspect ratio of the DRAM capacitor may be greater than about 20:1, greater than about 30:1, greater than about 40:1, greater than about 50:1, greater than about 60:1, greater than about 70:1, greater than about 80:1, greater than about 90:1, or greater than about 100:1. In some embodiments, the DRAM capacitor has an aspect ratio of greater than about 50:1. In other embodiments, the DRAM capacitor has an aspect ratio of greater than about 80:1. In yet other embodiments, the DRAM capacitor has an aspect ratio of greater than about 90:1. In yet still other embodiments, the DRAM capacitor has an aspect ratio of greater than about 100:1.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "semiconductor device" includes without limitation memory devices, as well as other semiconductor devices which may incorporate memory in addition to other functions such as, for example, a so-called "system on a chip" (SoC) including a processor and memory, or a semiconductor device including logic and memory.

FIG. 1 shows a cross-sectional view of a portion of a semiconductor structure 10 in an intermediate stage for utilization in methods of fabricating a semiconductor device (e.g., a memory device) having a DRAM capacitor according to embodiments of the disclosure. The semiconductor structure may include a substrate 12, a first silicate material 14, a first lattice material 16, a second silicate material 18, and a second lattice material 20. One or more materials of the first silicate material 14, the first lattice material 16, the second silicate material 18, and the second lattice material 20 may be selected to be selectively etchable relative to one another.

The substrate 12 may be a semiconductor material that may be doped or undoped. For example, the substrate 12 may be comprised of one or more of monocrystalline silicon (monosilicon), polycrystalline silicon (polysilicon), and amorphous silicon.

The first silicate material 14 may be formed (e.g., deposited) over the substrate 12. In some embodiments, the first silicate material 14 may be comprised of borophosphosilicate glass (BPSG). However, other silicate materials may be used. The first lattice material 16 may be formed (deposited) over the first silicate material 14. The first lattice material 16 may be formed from a dielectric material, such as a dielectric nitride material or a dielectric oxide material. For example, the first lattice material 16 may be comprised of one or more of silicon nitride, silicon oxide, and aluminum nitride.

The second silicate material 18 may be formed (e.g., deposited) over the first lattice material 16. In some embodiments, the second silicate material 18 may be comprised of tetraethyl orthosilicate (TEOS). However, other silicate materials may be used. The second lattice material 20 may be formed (deposited) over the second silicate material 18. Similar to the first lattice material 16, the second lattice material 20 may be formed from a dielectric material, such as a dielectric nitride or a dielectric oxide material. For example, the second lattice material 20 may be comprised of one or more of silicon nitride and aluminum nitride.

Openings 22 may be formed in the semiconductor structure extending from the second lattice material 20 to the substrate 12. For example, a dry-etch process may be utilized to create initial openings, followed by a vapor-based etch process to define the openings 22, such as by sculpting the openings 22.

Figure 2:
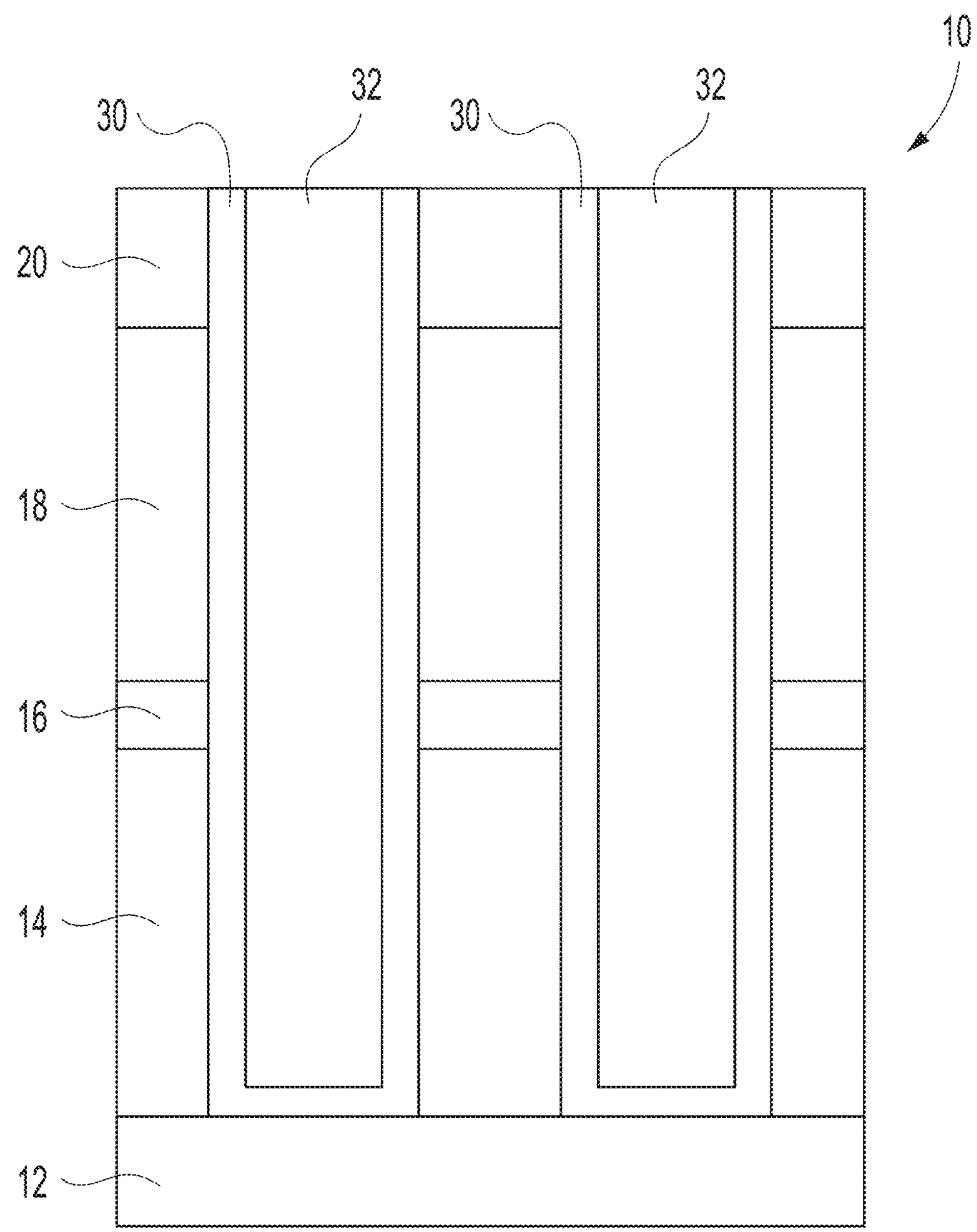

As shown in FIG. 2, a conductive material may be formed (e.g., deposited) within the openings to form first capacitor electrodes 30 (e.g., bottom electrodes). In some embodiments, each of the first capacitor electrodes 30 may be configured as a container, and a fill material 32 may be formed between opposing surfaces of the first capacitor electrodes 30, substantially filling the containers defined by the first capacitor electrodes 30. The fill material 32 may be sacrificial in that the material is removed before forming additional materials of a capacitor, such as a DRAM capacitor. Portions of the first capacitor electrodes 30 may be adjacent to (e.g., laterally adjacent to) a stack of the first silicate material 14, the first lattice material 16, the second silicate material 18, and the second lattice material 20.

The first capacitor electrodes 30 may be comprised of titanium nitride. In some embodiments, the titanium nitride may be doped with a metalloid element, a metal element, carbon, or combinations thereof. By way of example only, the dopant may be silicon, boron, aluminum, zirconium, hafnium, phosphorus, carbon, gallium, germanium, antimony, tellurium, arsenic, tungsten, or combinations thereof. The dopant may be selected based on resistivity or work function properties of the element. The doped TiN may include, but is not limited to, TiSiN, TiBN, TiAlN, TiPN, TiCN, TiGeN, TiAsN, TiWN, TiGaN, TiZrN, TiSbN, TiTeN, TiHfN, or TiN having two or more of the dopants. In some embodiments, the doped TiN is TiSiN. In other embodiments, the doped TIN is TiBN. The dopant may be present in the doped TiN at from about 0.1 atomic % (at. %) to about 25 at. %, such as from about 0.1 at. % to about 15 at. %, from about 0.1 at. % to about 10 at. %, or from about 1 at. % to about 5 at. %.

The fill material 32 may be a conductive material, such as a titanium nitride or a doped titanium nitride, or may be an insulating material such as silicon nitride, doped silicon nitride, a high-k dielectric material, or an air gap. The fill material 32 may include the same material or a different material as the material of the first capacitor electrodes 30. The fill material 32 may be adjacent to (e.g., laterally adjacent to) the first capacitor electrodes 30, extending along a length thereof.

Figure 3:
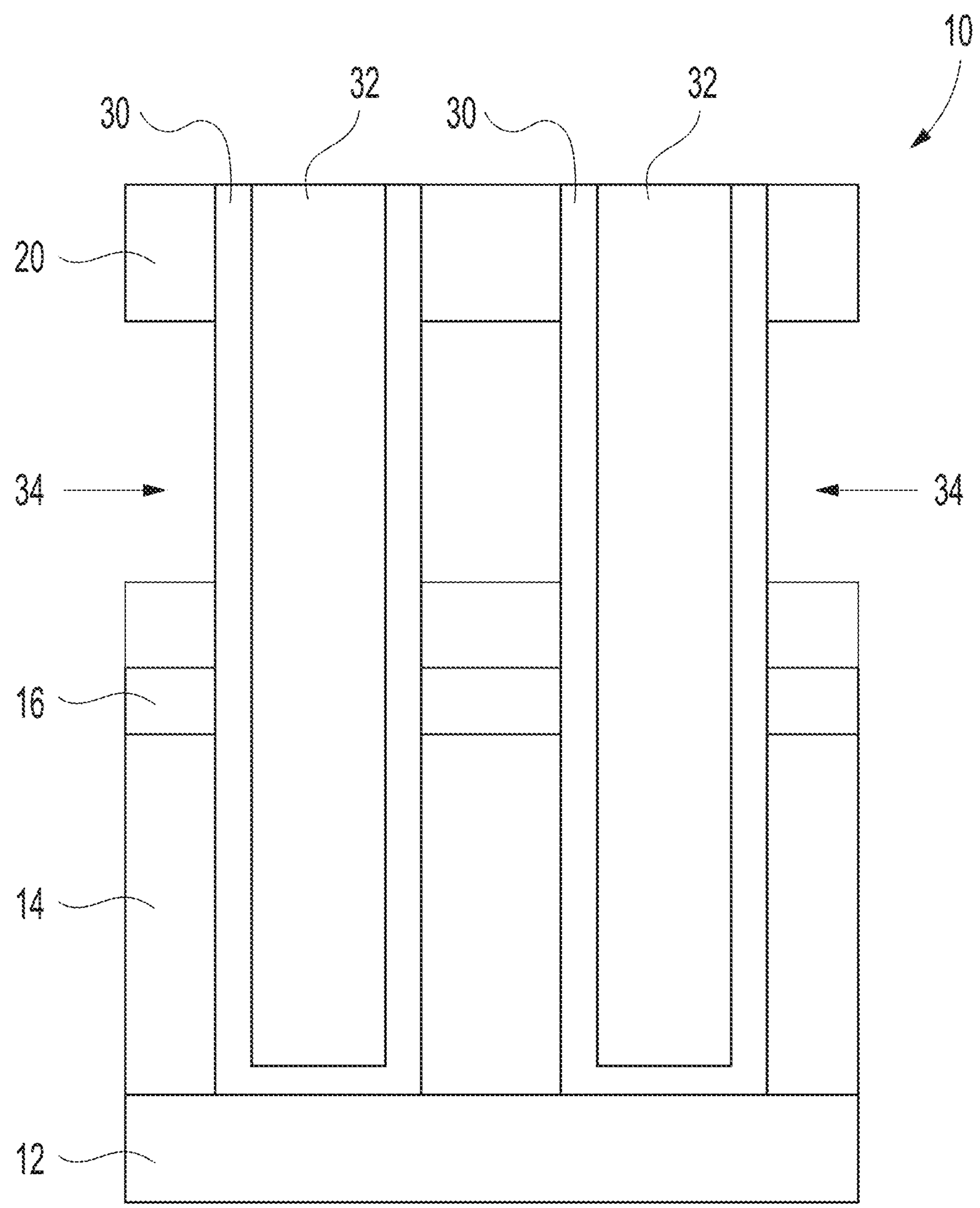

After the first capacitor electrodes 30 have been formed, an upper portion 34 of the first capacitor electrodes 30 may be exposed, as shown in FIG. 3. To expose the upper portion 34 of the first capacitor electrodes 30, at least a portion of the surrounding second silicate material 18 may be selectively removed. For example, the second silicate material 18 may be comprised of TEOS and may be removed (e.g., etched) by one or more of buffered hydrofluoric acid etching, diluted hydrofluoric acid etching, and vapor etching.

Figure 4:
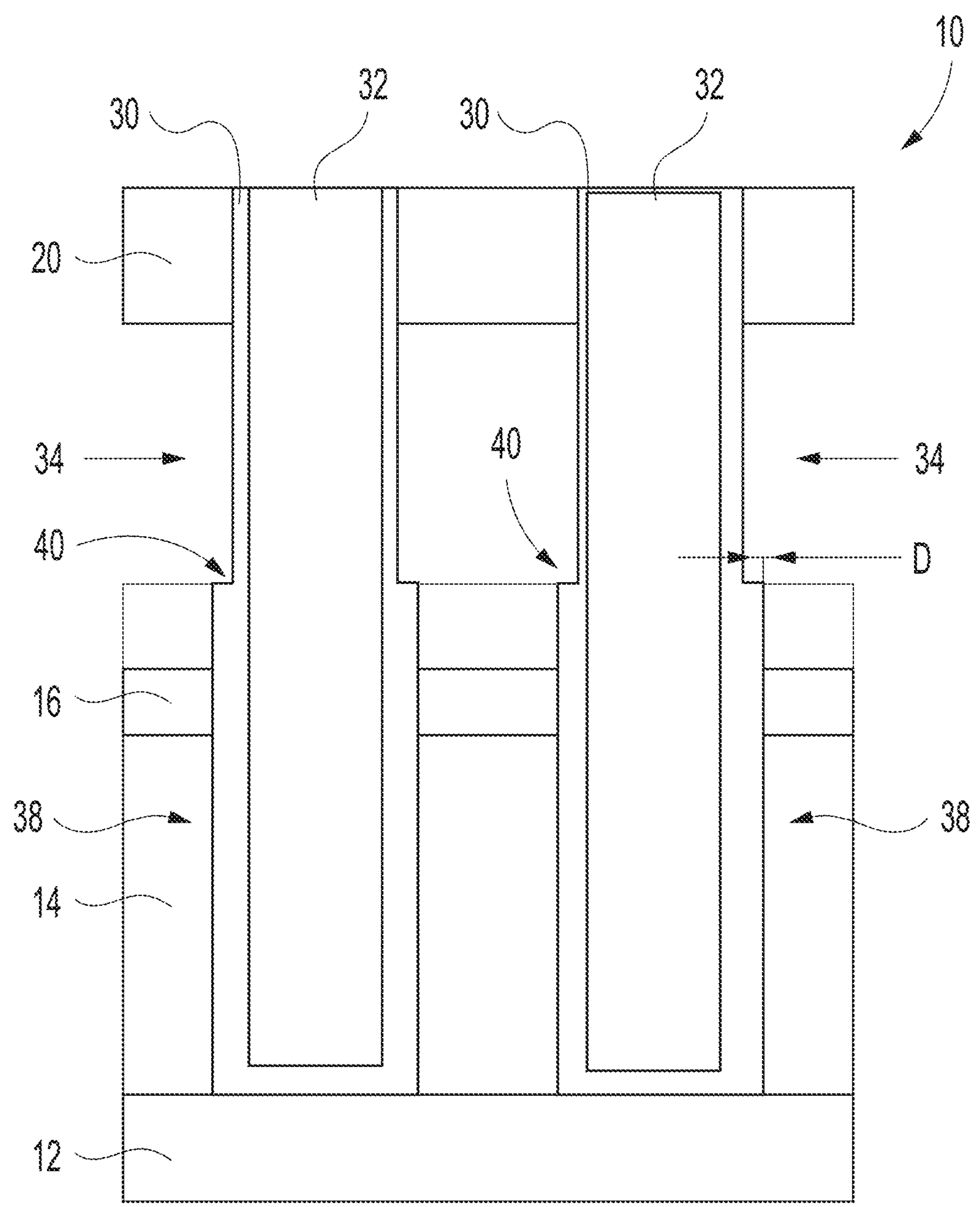

After the upper portion 34 of first capacitor electrodes 30 is exposed, a portion of the upper portion 34 of the first capacitor electrodes 30 may be removed (e.g., thinned), as shown in FIG. 4. Thinning the exposed upper portion 34 of the first capacitor electrodes 30 may comprise removing between about 1 Angstrom (Å) and about 50 Å of the material of the first capacitor electrodes 30. In some embodiments, thinning the exposed upper portion 34 of the first capacitor electrodes 30 may comprise removing between about 5 Å and about 20 Å. In further embodiments, thinning the exposed upper portion 34 of the first capacitor electrodes 30 may comprise removing between about 20 Å and about 40 Å. In yet further embodiments, thinning the exposed upper portion 34 of the first capacitor electrodes 30 may comprise removing between about 40 Å and about 50 Å. As shown in FIG. 4, a width of the upper portion 34 of the first capacitor electrodes 30 may be less than a width of the lower portion 38 of the first capacitor electrodes 30.

The upper portion 34 of the first capacitor electrodes 30 may have a portion of material removed by an etching process. In some embodiments, thinning the upper portion 34 of the first capacitor electrode 30 may comprise etching the upper portion 34 of the first capacitor electrodes 30 with one or more of hydrogen peroxide; an ammonia and hydrogen peroxide mixture; an ammonium hydroxide, hydrogen peroxide, and water mixture; and an oxygen plasma. In additional embodiments, thinning the upper portion 34 of the first capacitor electrode 30 may comprise vapor etching the upper portion 34 of the first capacitor electrode 30.

As a lower portion 38 of the first capacitor electrodes 30 is not exposed to the etch conditions, due to the surrounding first silicate material 14 and any remaining second silicate material 18, the lower portion 38 of the first capacitor electrode 30 may not have a portion of material removed during the removal of material from the upper portion 34 of the first capacitor electrode 30. In other words, the width of the lower portion 38 is substantially equal to the width of the as-formed material of the first capacitor electrode 30. Accordingly, a step transition 40 may be formed in the first capacitor electrodes between the upper portion 34 and the lower portion 38. The step transition 40 is a location where there is an abrupt change in thickness between the upper portion 34 and the lower portion 38 of the first capacitor electrode 30, such as at an interface between the upper portion 34 and the lower portion 38. The difference between the thicknesses of the upper portion 34 and the lower portion 38 of the first capacitor electrode 30 at the step transition 40 may have a dimension D that is substantially the same as the thickness of material removed from the upper portion 34 of the first capacitor electrode 30 during the thinning process. In some embodiments, the difference in width between the upper portion 34 of the first capacitor electrode 30 and the lower portion 38 of the first capacitor electrode 30 at the step transition 40 may be between about 1 Å and about 50 Å. In additional embodiments, the difference in width between the upper portion 34 of the first capacitor electrode 30 and the lower portion 38 of the first capacitor electrode 30 at the step transition 40 may be between about 5 Å and about 20 Å. In further embodiments, the difference in width between the upper portion 34 of the first capacitor electrode 30 and the lower portion 38 of the first capacitor electrode 30 at the step transition 40 may be between about 20 Å and about 40 Å. In yet further embodiments, the difference in width between the upper portion 34 of the first capacitor electrode 30 and the lower portion 38 of the first capacitor electrode 30 at the step transition 40 may be between about 40 Å and about 50 Å.

Figure 5:
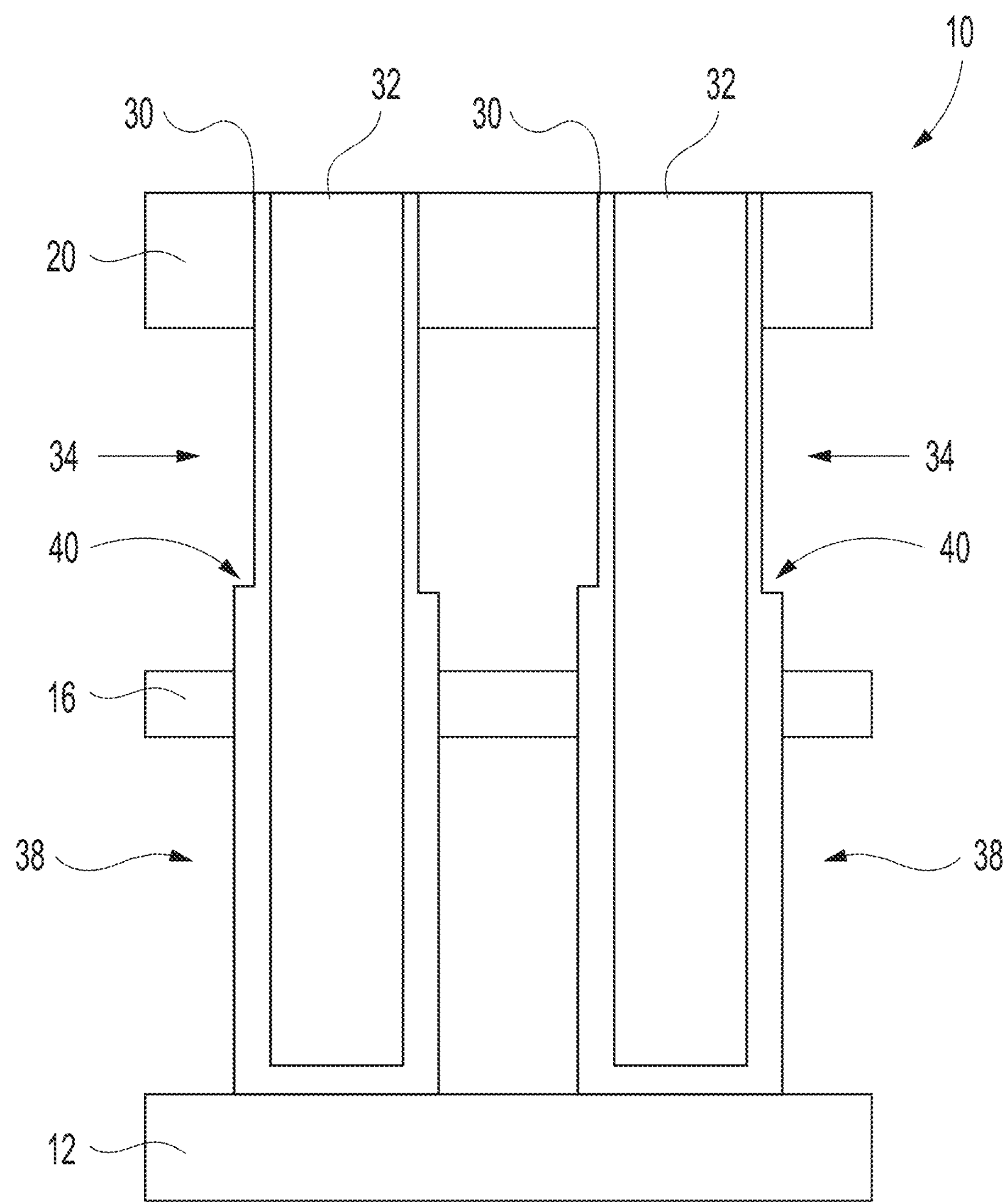

After the upper portion 34 of the first capacitor electrodes 30 has been removed, the remainder of the first silicate material 14 and the second silicate material 18 may be removed to expose the lower portion 38 of the first capacitor electrode 30, as shown in FIG. 5. Exposing the lower portion 38 of the first capacitor electrode 30 may comprise removing (e.g., etching) a remainder of the second silicate material 18 (e.g., TEOS material) surrounding the lower portion 38 of the first capacitor electrode 30 and etching the first silicate material 14 (e.g., a BPSG material) surrounding the lower portion 38 of the first capacitor electrode 30. For example, the remainder of the second silicate material 18 and the first silicate material 14 may be removed by one or more of buffered hydrofluoric acid etching, diluted hydrofluoric acid etching, and vapor etching. The second silicate material 18 and the first silicate material 14 may be selectively removed relative to the first lattice material 16, the second lattice material 20, and the substrate 12.

Figure 6:
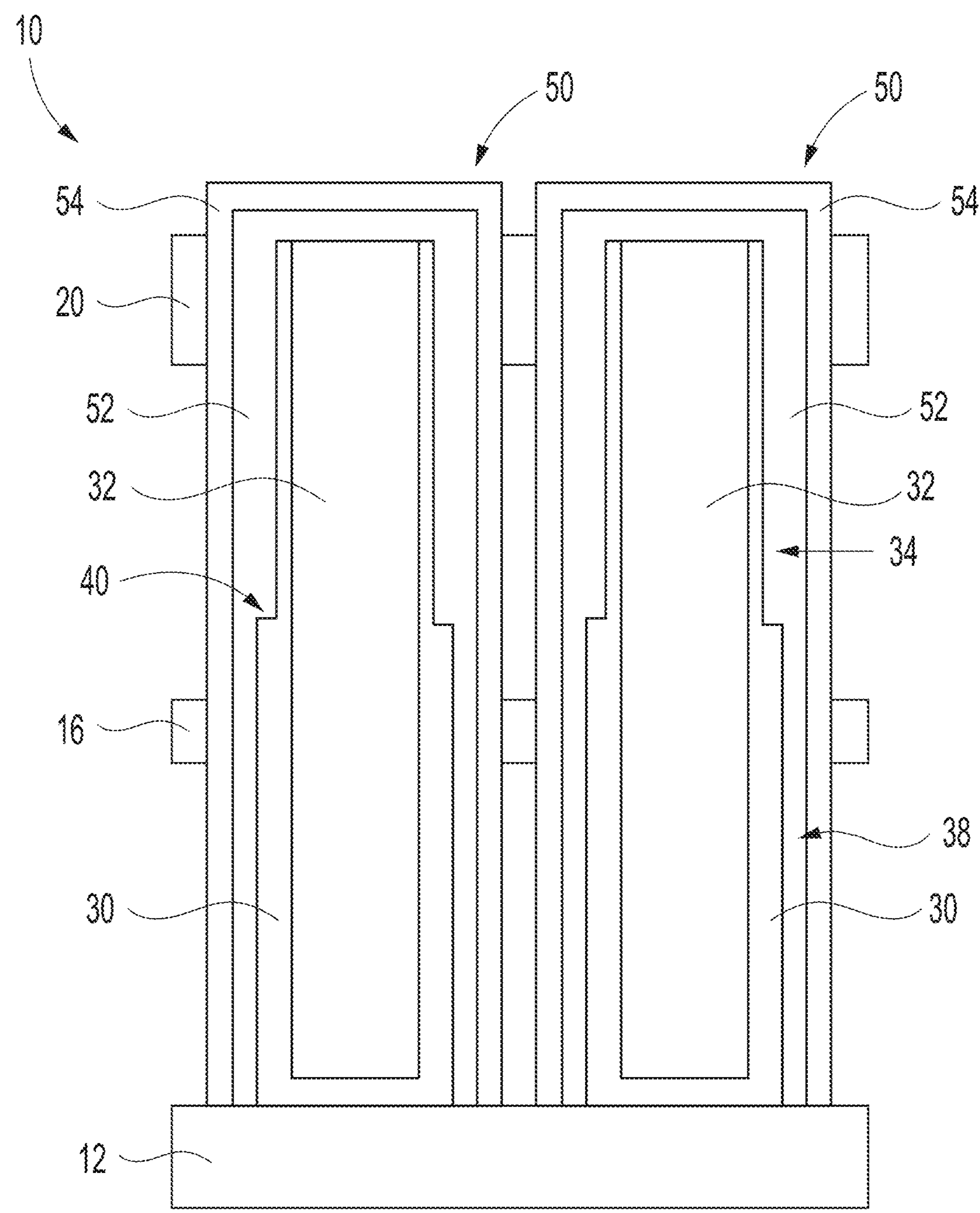

As shown in FIG. 6, after the lower portion 38 of the first capacitor electrode 30 has been exposed, the remaining capacitor structure may be formed to provide a DRAM capacitor 50. A capacitor dielectric 52 may be formed adjacent to (e.g., on) the first capacitor electrode 30 and a second capacitor electrode 54 (e.g., a top electrode) may be formed adjacent to (e.g., on) the first capacitor electrode 30, with the capacitor dielectric 52 between the first and second capacitor electrodes 30, 54. The first lattice material 16 and the second lattice material 20 may provide additional support to the DRAM capacitor 50. While two lattice materials are illustrated, the DRAM capacitor 50 may include more lattice materials or fewer lattice materials. The capacitor dielectric 52 is formed on sidewalls of the first capacitor electrode 30, including on sidewalls and upper surfaces of the step transition 40. Therefore, a width of the capacitor dielectric 52 adjacent to the upper portions 34 of the first capacitor electrodes 30 may be greater than a width of the capacitor dielectric 52 adjacent to the lower portions 38 of the first capacitor electrodes 30, as shown most clearly in FIG. 6. Alternatively, the width of the capacitor dielectric 52 may be substantially constant over the entire first capacitor electrodes 30.

The capacitor dielectric 52 may be formed of an electrically insulative material including, but not limited to, an electrically insulative oxide or an electrically insulative nitride. By way of example only, the capacitor dielectric 52 may comprise, consist essentially of, or consist of hafnium oxide, silicon dioxide, silicon nitride, zirconium oxide, or combinations thereof. In some embodiments, the capacitor dielectric 52 is zirconium oxide. The capacitor dielectric 52 may be formed by conventional techniques, such as by a physical vapor deposition ("PVD") technique, a CVD technique, or an ALD technique. PVD includes, but is not limited to, sputtering, evaporation, or ionized PVD. Such deposition techniques are known in the art and, therefore, are not described in detail herein.

The second capacitor electrode 54 may be formed of a conductive material including, but not limited to, a metal (e.g., platinum, titanium, tungsten, ruthenium, etc.), a metal-containing composition (e.g., a metal nitride, a metal silicide, etc.), or a conductively doped semiconductor material (e.g., conductively doped silicon, conductively doped germanium, etc.). The second capacitor electrode 54 may be formed by conventional techniques, such as by a PVD technique, a CVD technique, or an ALD technique. A width of the second capacitor electrode 54 may be substantially equal along an entire length thereof.

The first and second lattice materials 16, 20 may be configured to provide additional structural support to the DRAM capacitors 50, preventing or reducing toppling, collapse, and wobbling of the DRAM capacitors 50. The first and second lattice materials 16, 20 may be formed of an electrically insulative material, such as silicon nitride or a silicon oxide. The first and second lattice materials 16, 20 may have any desired thickness, such as a thickness of from about 50 Å to about 3000 Å, or from about 50 Å to about 1000 Å. One or more of the first and second lattice materials 16, 20 may be present along the height of the first capacitor electrode 30, such as at least one of a top portion of the first capacitor electrode 30, a middle portion of the first capacitor electrode 30, or a bottom portion of the first capacitor electrode 30. The number of lattice materials may depend on the height of the DRAM capacitors 50 and the mechanical support provided by the first capacitor electrode 30, as long as lateral movement of the DRAM capacitors 50 is suitably reduced or prevented.

The DRAM capacitor 50 may be a high aspect ratio (HAR) capacitor having an aspect ratio of greater than about 20:1, greater than about 30:1, greater than about 40:1, greater than about 50:1, greater than about 60:1, greater than about 70:1, greater than about 80:1, greater than about 90:1, or greater than about 100:1. For example, the aspect ratio of the DRAM capacitor 50 may be from about 20:1 to about 100:1, such as from about 20:1 to about 30:1, from about 50:1 to about 100:1, or from about 80:1 to about 100:1. In some embodiments, the aspect ratio of the DRAM capacitor 50 is about 100:1. To achieve the high aspect ratio, a diameter (or width) and a height of the DRAM capacitor 50 may be appropriately sized. By way of example only, the diameter (or width) of the DRAM capacitor 50 may be less than or equal to about 650 Å, such as less than or equal to about 400 Å, less than or equal to about 350 Å, less than or equal to about 200 Å, or less than or equal to about 100 Å. The height of the DRAM capacitor 50 may be greater than or equal to about $0.5 \times 10^4$ Å, such as greater than or equal to about $1.0 \times 10^4$ Å, greater than or equal to about $1.5 \times 10^4$ Å, or greater than or equal to about $2.0 \times 10^4$ Å.

The increased space provided between adjacent upper portions 34 of the first capacitor electrodes 30 (see FIGS. 3 and 4) may allow the first capacitor electrodes 30 to be positioned closely together while providing increased space between the upper portion 34 of the first capacitor electrodes 30 for the capacitor dielectric 52 and the second capacitor electrodes 54 to be formed. The increased space reduces problems associated with pinching of the capacitor dielectric 52 and pinching and/or shorting of the second capacitor electrodes 54.

After the first capacitor electrodes 30 have been formed, an upper portion 34 of the first capacitor electrodes 30 may be exposed, as shown in FIG. 3. To expose the upper portion 34 of the first capacitor electrodes 30, at least a portion of the surrounding second silicate material 18 may be selectively removed. For example, the second silicate material 18 may be comprised of TEOS and may be removed (e.g., etched) by one or more of buffered hydrofluoric acid etching, diluted hydrofluoric acid etching, and vapor etching.

After the upper portion 34 of first capacitor electrodes 30 is exposed, a portion of the upper portion 34 of the first capacitor electrodes 30 may be removed (e.g., thinned), as shown in FIG. 4. Thinning the exposed upper portion 34 of the first capacitor electrodes 30 may comprise removing between about 1 Angstrom (Å) and about 50 Å of the material of the first capacitor electrodes 30. In some embodiments, thinning the exposed upper portion 34 of the first capacitor electrodes 30 may comprise removing between about 5 Å and about 20 Å. In further embodiments, thinning the exposed upper portion 34 of the first capacitor electrodes 30 may comprise removing between about 20 Å and about 40 Å of the material of the first capacitor electrodes 30. In yet further embodiments, thinning the exposed upper portion 34 of the first capacitor electrodes 30 may comprise removing between about 40 Å and about 50 Å. As shown in FIG. 4, a width of the upper portion 34 of the first capacitor electrodes 30 may be less than a width of the lower portion 38 of the first capacitor electrodes 30.

The upper portion 34 of the first capacitor electrodes 30 may have a portion of material removed by the etching process. In some embodiments, thinning the upper portion 34 of the first capacitor electrode 30 may comprise etching the upper portion 34 of the first capacitor electrodes 30 with one or more of hydrogen peroxide; an ammonia and hydrogen peroxide mixture; an ammonium hydroxide, hydrogen peroxide, and water mixture; and an oxygen plasma. In additional embodiments, thinning the upper portion 34 of the first capacitor electrode 30 may comprise vapor etching the upper portion 34 of the first capacitor electrode 30.

As a lower portion 38 of the first capacitor electrodes 30 is not exposed to the etch conditions, due to the surrounding first silicate material 14 and any remaining second silicate material 18, the lower portion 38 of the first capacitor electrode 30 may not have a portion of material removed during the removal of material from the upper portion 34 of the first capacitor electrode 30. In other words, the width of the lower portion 38 is substantially equal to the width of the as-formed material of the first capacitor electrode 30. Accordingly, a step transition 40 may be formed in the first capacitor electrodes between the upper portion 34 and the lower portion 38. The step transition 40 is a location where there is an abrupt change in thickness between the upper portion 34 and the lower portion 38 of the first capacitor electrode 30, such as at an interface between the upper portion 34 and the lower portion 38. The difference between the thicknesses of the upper portion 34 and the lower portion 38 of the first capacitor electrode 30 at the step transition 40 may have a dimension D that is substantially the same as the thickness of material removed from the upper portion 34 of the first capacitor electrode 30 during the thinning process. In some embodiments, the difference in width between the upper portion 34 of the first capacitor electrode 30 and the lower portion 38 of the first capacitor electrode 30 at the step transition 40 may be between about 1 Å and about 50 Å. In additional embodiments, the difference in width between the upper portion 34 of the first capacitor electrode 30 and the lower portion 38 of the first capacitor electrode 30 at the step transition 40 may be between about 5 Å and about 20 Å. In further embodiments, the difference in width between the upper portion 34 of the first capacitor electrode 30 and the lower portion 38 of the first capacitor electrode 30 at the step transition 40 may be between about 20 Å and about 40 Å. In yet further embodiments, the difference in width between the upper portion 34 of the first capacitor electrode 30 and the lower portion 38 of the first capacitor electrode 30 at the step transition 40 may be between about 40 Å and about 50 Å.

In additional embodiments, a larger or smaller upper portion 34 of the first capacitor electrodes 30 may be exposed relative to what is shown and described with reference to FIG. 3. For example, as shown in FIG. 4.1, the upper portion 34 of the first capacitor electrode 30 that is exposed may be relatively near to the second lattice material 20 when compared to FIG. 3.

After the upper portion 34 of first capacitor electrodes 30 is exposed, a portion of the upper portion 34 of the first capacitor electrodes 30 may be removed (e.g., thinned), as shown in FIG. 4.1, and as described with reference to FIG. 4. As shown in FIG. 4.1, a width of the upper portion 34 of the first capacitor electrodes 30 may be less than a width of the lower portion 38 of the first capacitor electrodes 30. Accordingly, a step transition 40 may be formed in the first capacitor electrodes between the upper portion 34 and the lower portion 38. The step transition 40 is a location where there is an abrupt change in thickness between the upper portion 34 and the lower portion 38 of the first capacitor electrode 30, such as at an interface between the upper portion 34 and the lower portion 38. The difference between the thicknesses of the upper portion 34 and the lower portion 38 of the first capacitor electrode 30 at the step transition 40 may have a dimension D that is substantially the same as the thickness of material removed from the upper portion 34 of the first capacitor electrode 30 during the thinning process. An additional transition may, optionally, be present proximal to the second lattice material 20.

In further embodiments, as shown in FIG. 4.2, the upper portion 34 of the first capacitor electrode 30 that is exposed may extend to the first lattice material 16. Similarly as described with reference to FIG. 4, after the upper portion 34 of first capacitor electrodes 30 is exposed, a portion of the upper portion 34 of the first capacitor electrodes 30 may be removed (e.g., thinned). As shown in FIG. 4.2, a width of the upper portion 34 of the first capacitor electrodes 30 may be less than a width of the lower portion 38 of the first capacitor electrodes 30. Accordingly, a step transition 40 may be formed in the first capacitor electrodes between the upper portion 34 and the lower portion 38. The difference between the thicknesses of the upper portion 34 and the lower portion 38 of the first capacitor electrode 30 at the step transition 40 may have a dimension D that is substantially the same as the thickness of material removed from the upper portion 34 of the first capacitor electrode 30 during the thinning process. An additional transition may, optionally, be present proximal to the second lattice material 20.

For another example, as shown in FIG. 4.3, the upper portion 34 of the first capacitor electrode 30 that is exposed may extend beyond the first lattice material 16. Accordingly, the second silicate material 18 and a portion of the first silicate material 14 may be removed to expose the upper portion 34 of the first capacitor electrode 30 extending beyond the first lattice material 16. Similarly as described with reference to FIG. 4, after the upper portion 34 of first capacitor electrodes 30 is exposed, a portion of the upper portion 34 of the first capacitor electrodes 30 may be removed (e.g., thinned). As shown in FIG. 4.3, a width of the upper portion 34 of the first capacitor electrodes 30 may be less than a width of the lower portion 38 of the first capacitor electrodes 30. Accordingly, a step transition 40 may be formed in the first capacitor electrodes between the upper portion 34 and the lower portion 38. The difference between the thicknesses of the upper portion 34 and the lower portion 38 of the first capacitor electrode 30 at the step transition 40 may have a dimension D that is substantially the same as the thickness of material removed from the upper portion 34 of the first capacitor electrode 30 during the thinning process.

In further embodiments, the semiconductor structure 10 may include additional lattice materials. As shown in FIG. 4.4, the semiconductor structure may include the first lattice material 16, the second lattice material 20, and a third lattice material 16'. The third lattice material 16' may be formed substantially as described above for the first lattice material 16. Accordingly, a semiconductor structure 10, according to embodiments of the present disclosure, may include any number of lattice materials.

As shown in FIG. 4.4, the upper portion 34 of the first capacitor electrode 30 that is exposed may extend between the first lattice material 16 and the third lattice material 16'. Similarly as described with reference to FIG. 4, after the upper portion 34 of first capacitor electrodes 30 is exposed, a portion of the upper portion 34 of the first capacitor electrodes 30 may be removed (e.g., thinned). As shown in FIG. 4.4, a width of the upper portion 34 of the first capacitor electrodes 30 may be less than a width of the lower portion 38 of the first capacitor electrodes 30. Accordingly, a step transition 40 may be formed in the first capacitor electrodes between the upper portion 34 and the lower portion 38. The difference between the thicknesses of the upper portion 34 and the lower portion 38 of the first capacitor electrode 30 at the step transition 40 may have a dimension D that is substantially the same as the thickness of material removed from the upper portion 34 of the first capacitor electrode 30 during the thinning process.

In yet further embodiments, after the step transition 40 is formed in the first capacitor electrodes 30 as described with reference to FIG. 4, a second step transition 40' may be formed in the first capacitor electrodes as shown in FIG. 4.5. Accordingly, after the step transition 40 is formed in the first capacitor electrodes 30 (as described with reference to FIG. 4), additional silicate material may be removed to expose another portion of the first capacitor electrodes 30. For example, the remainder of the second silicate material 18 and a portion of the first silicate material 14 may be removed to expose a second upper portion 34' of the first capacitor electrode 30 extending beyond the first lattice material 16, as shown in FIG. 4.5. Similarly as described with reference to FIG. 4, after the second upper portion 34' of first capacitor electrodes 30 is exposed, a portion of the second upper portion 34' of the first capacitor electrodes 30 may be removed (e.g., thinned). Simultaneously, an additional portion of the upper portion 34 of the first capacitor electrodes 30 may be removed, as shown in FIG. 4.5.

Thinning the exposed upper portion 34 and second upper portion 34' of the first capacitor electrodes 30 may comprise removing between about 1 Angstrom (Å) and about 50 Å of the material of the first capacitor electrodes 30. In some embodiments, thinning the exposed upper portion 34 and second upper portion 34' of the first capacitor electrodes 30 may comprise removing between about 5 Å and about 20 Å. In further embodiments, thinning the exposed upper portion 34 and second upper portion 34' of the first capacitor electrodes 30 may comprise removing between about 20 Å and about 40 Å. In yet further embodiments, thinning the exposed upper portion 34 and second upper portion 34' of the first capacitor electrodes 30 may comprise removing between about 40 Å and about 50 Å.

As shown in FIG. 4.5, a width of the upper portion 34 of the first capacitor electrodes 30 may be less than a width of the second upper portion 34' of the first capacitor electrodes 30, which may be less than the lower portion 38 of the first capacitor electrodes 30.

Accordingly, a step transition 40 may be formed in the first capacitor electrodes 30 between the upper portion 34 and the second upper portion 34', and a second step transition 40' may be formed in the first capacitor electrodes 30 between the second upper portion 34' and the lower portion 38. The difference between the thicknesses of the upper portion 34 and the second upper portion 34' of the first capacitor electrode 30 at the step transition 40 may have a dimension $D_1$. The difference between the thicknesses of the second upper portion 34' and the lower portion 38 of the first capacitor electrode 30 at the step transition 40 may have a dimension $D_2$.

In some embodiments, the difference in width between the upper portion 34 of the first capacitor electrode 30 and the lower portion 38 of the first capacitor electrode 30 (i.e., the sum of $D_1$ and $D_2$) may be between about 1 Å and about 50 Å. Accordingly, a difference in width between the upper portion 34 of the first capacitor electrode 30 adjacent the step transition 40 and the lower portion 38 of the first capacitor electrode 30 adjacent the second step transition 40' may be between about 1 Å and about 50 Å. In additional embodiments, the difference in width between the upper portion 34 of the first capacitor electrode 30 and the lower portion 38 of the first capacitor electrode 30 (i.e., the sum of $D_1$ and $D_2$) may be between about 5 Å and about 20 Å. In further embodiments, the difference in width between the upper portion 34 of the first capacitor electrode 30 and the lower portion 38 of the first capacitor electrode 30 (i.e., the sum of $D_1$ and $D_2$) may be between about 20 Å and about 40 Å. In yet further embodiments, the difference in width between the upper portion 34 of the first capacitor electrode 30 and the lower portion 38 of the first capacitor electrode 30 (i.e., the sum of $D_1$ and $D_2$) may be between about 40 Å and about 50 Å.

Accordingly, a DRAM capacitor is disclosed and comprises a first capacitor electrode comprising a lower portion, an upper portion, and a first step transition between the lower portion and the upper portion, a width of the upper portion of the first capacitor electrode at the first step transition is less than a width of the lower portion of the first capacitor electrode at the first step transition, a capacitor dielectric on the first capacitor electrode, and a second capacitor electrode on the capacitor dielectric.

Accordingly, a method of forming a DRAM capacitor is disclosed. The method comprises forming a first capacitor electrode comprising exposing an upper portion of the first capacitor electrode, and removing a portion of the upper portion of the first capacitor electrode. The method further comprises exposing a lower portion of the first capacitor electrode after removing the portion of the upper portion of the first capacitor electrode, forming a capacitor dielectric on the first capacitor electrode, and forming a second capacitor electrode on the capacitor dielectric.

Figure 7:
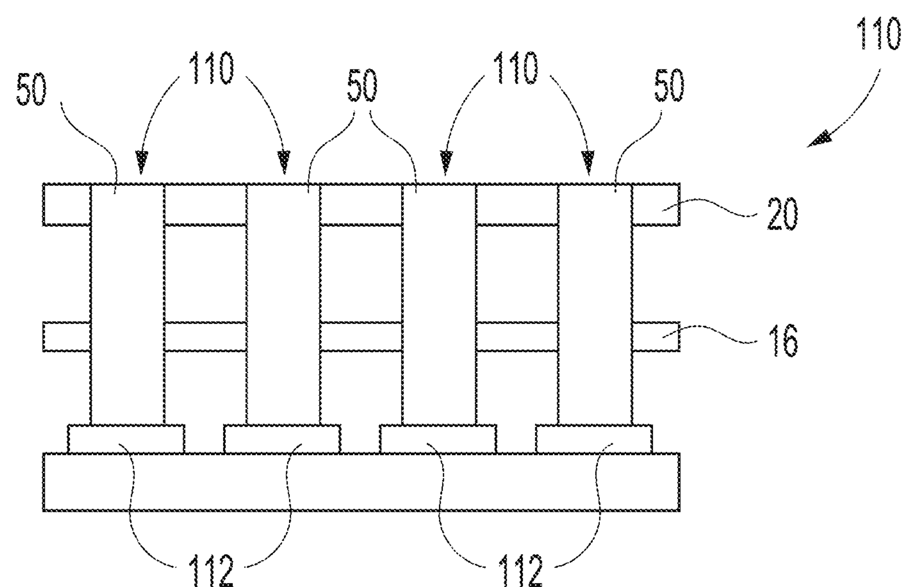
FIG. 7 is a schematic, cross-sectional view of a DRAM device in accordance with some embodiments of the disclosure.

A memory device (e.g., DRAM device 100) including memory cells 110 comprising the DRAM capacitors 50 is shown in FIG. 7. The DRAM device 100 includes a DRAM memory array that includes the memory cells 110 comprising the DRAM capacitors 50 in accordance with some embodiments of the disclosure. The memory cells 110 may be DRAM memory cells that include the DRAM capacitors 50 and access devices 112, such as transistors, operably coupled to the DRAM capacitors 50. The access device 112 includes a source region, a drain region, and a channel region and enables a read and/or write operation of a charge stored in the DRAM capacitor 50. In FIG. 7, the DRAM capacitors 50 are illustrated as a single structure for simplicity and convenience. However, the DRAM capacitors 50 include embodiments of the first capacitor electrode 30 (e.g., the bottom electrode) including the step transition 40 between the lower portion 38 and the upper portion 34, as previously described, the capacitor dielectric 52, and the second capacitor electrode 54 (e.g., the top electrode), with the capacitor dielectric 52 between the first and second capacitor electrodes 30, 54. The DRAM device 100 also optionally includes the first lattice material 16 and the second lattice material 20.

Figure 8:
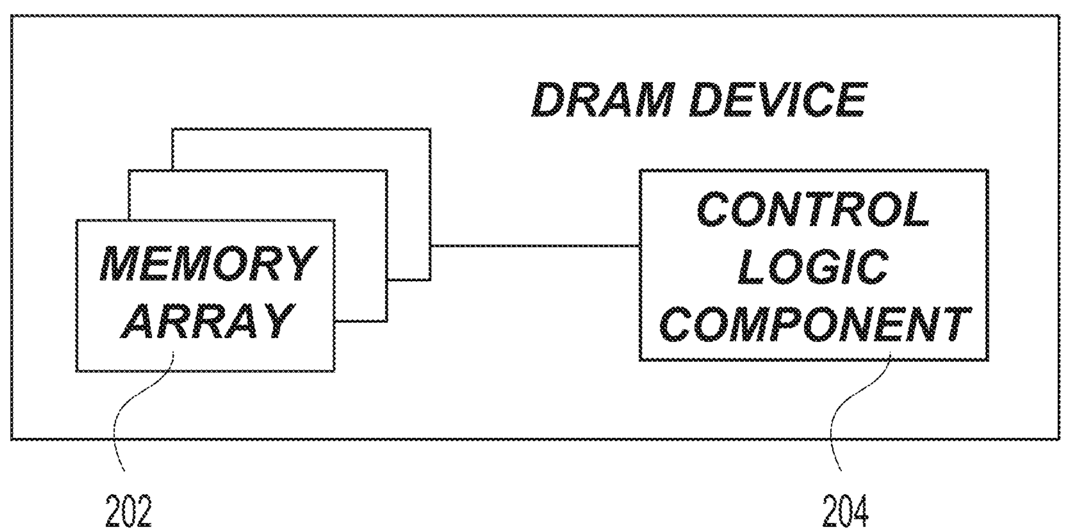
FIG. 8 is a simplified block diagram of a DRAM device including a memory array in accordance with some embodiments of the disclosure.

FIG. 8 is a simplified block diagram of a DRAM device 100 implemented according to one or more embodiments described herein. The DRAM device 100 includes a memory array 202 and a control logic component 204. The memory array 202 may include the memory cells 110 as described above. The control logic component 204 may be operatively coupled with the memory array 202 so as to read, write, or re-fresh any or all memory cells 110 within the memory array 202.

Accordingly, a semiconductor device is disclosed. The semiconductor device comprises DRAM capacitors and access devices operably coupled to the DRAM capacitors. At least one DRAM capacitor of the DRAM capacitors comprises a first capacitor electrode comprising a lower portion, an upper portion, and having a difference in width between the upper portion of the first capacitor electrode and the lower portion of the first capacitor electrode at a step transition between about 1 Å and about 50 Å, a capacitor dielectric adjacent to the first capacitor electrode, and a second capacitor electrode adjacent to the capacitor dielectric.

Figure 9:
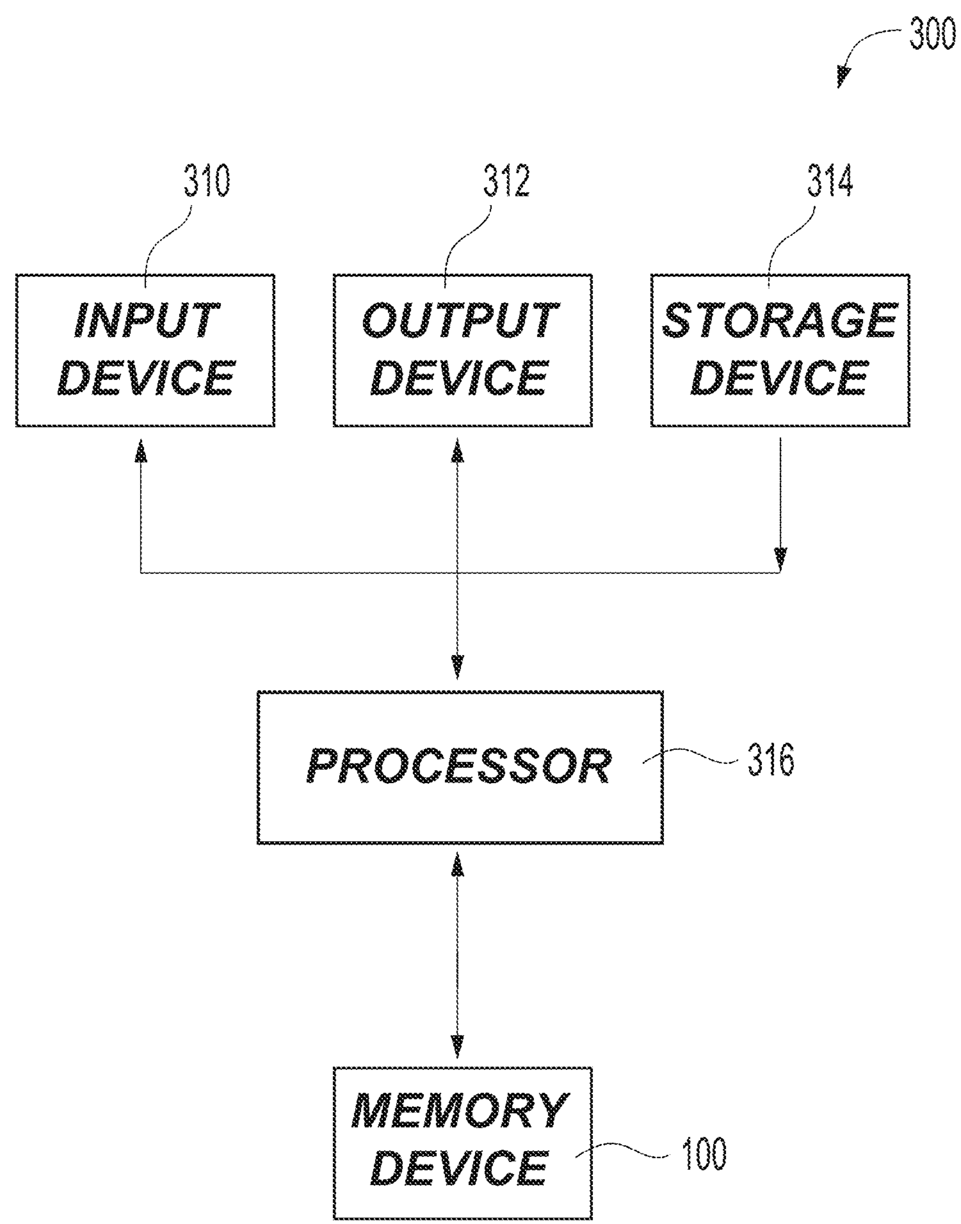
FIG. 9 is a simplified block diagram of a system implemented in accordance with some embodiments of the disclosure.

A system 300 is also disclosed. The system 300 comprises a memory array 202 that includes the memory cells 110, as shown in FIG. 9. Each memory cell 110 includes the access device 112 and the DRAM capacitor 50 operably coupled with the access device 112, with the DRAM capacitor 50 configured as discussed above. FIG. 9 is a simplified block diagram of the system 300 implemented according to one or more embodiments described herein. The system 300 includes at least one input device 310. The input device 310 may be a keyboard, a mouse, or a touch screen. The system 300 further includes at least one output device 312. The output device 312 may be a monitor, touch screen, or speaker. The input device 310 and the output device 312 are not necessarily separable from one another. The system 300 further includes a storage device 314. The input device 310, output device 312, and storage device 314 are coupled to a processor 316. The system 300 further includes the DRAM device 100 coupled to the processor 316, with the DRAM device 100 including at least one memory cell 110. The DRAM device 100 may include an array of memory cells 110. The system 300 may include a computing, processing, industrial, or consumer product. For example, without limitation, the system 300 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

Accordingly, a system is disclosed. The system comprises a memory array comprising memory cells, the memory cells comprising DRAM capacitors and access devices operably coupled to the DRAM capacitors. At least one DRAM capacitor of the DRAM capacitors comprises a first capacitor electrode comprising a lower portion, an upper portion, the lower portion having a greater thickness than the upper portion, a capacitor dielectric adjacent to the first capacitor electrode, and a second capacitor electrode adjacent to the capacitor dielectric.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A DRAM capacitor, comprising:

a first capacitor electrode comprising a proximal base disposed on a substrate and opposing portions extending from the proximal base, the opposing portions configured as a container, the opposing portions comprising a lower portion, an upper portion, and a first step transition between the lower portion and the upper portion, a width of the upper portion at the first step transition is less than a width of the lower portion at the first step transition;

a capacitor dielectric adjacent to the first capacitor electrode; and a second capacitor electrode adjacent to the capacitor dielectric.

2. The DRAM capacitor of claim 1, wherein a difference in width between the upper portion and the lower portion at the first step transition is between about 1 Å and about 50 Å.

3. The DRAM capacitor of claim 2, wherein a difference in width between the upper portion and the lower portion at the first step transition is between about 5 Å and about 20 Å.

4. The DRAM capacitor of claim 2, wherein a difference in width between the upper portion and the lower portion at the first step transition is between about 20 Å and about 40 Å.

5. The DRAM capacitor of claim 2, wherein a difference in width between the upper portion and the lower portion at the first step transition is between about 40 Å and about 50 Å.

6. The DRAM capacitor of claim 1, wherein the first capacitor electrode comprises titanium nitride.

7. The DRAM capacitor of claim 1, wherein the first capacitor electrode comprises a doped titanium nitride.

8. The DRAM capacitor of claim 7, wherein the doped titanium nitride comprises titanium nitride doped with one or more of silicon, boron, aluminum, zirconium, hafnium, phosphorus, carbon, gallium, germanium, antimony, tellurium, arsenic, or tungsten.

9. The DRAM capacitor of claim 1, further comprising at least one lattice material laterally adjacent to the first capacitor electrode.

10. The DRAM capacitor of claim 1, further comprising a second step transition between the lower portion and the upper portion.

11. The DRAM capacitor of claim 10, wherein a difference in width between the upper portion adjacent the first step transition and the lower portion adjacent the second step transition is between about 1 Å and about 50 Å.

12. A semiconductor device comprising:

DRAM capacitors, at least one DRAM capacitor of the DRAM capacitors comprising:

a first capacitor electrode and a laterally adjacent first capacitor electrode, the first capacitor electrode and the laterally adjacent first capacitor electrode each comprising a lower portion and an upper portion, the lower portion having a different width than the upper portion at a step transition, a difference in width between the lower portion and the upper portion at the step transition being between about 1 Å and about 50 Å, and a distance between an outer surface of the first capacitor electrode and an outer surface of the laterally adjacent first capacitor electrode being greater between respective upper portions of the first capacitor electrode and the laterally adjacent first capacitor electrode than between respective lower portions of the first capacitor electrode and the laterally adjacent first capacitor electrode;

a capacitor dielectric on the first capacitor electrode and the laterally adjacent first capacitor electrode; and a second capacitor electrode and a laterally adjacent second capacitor electrode on the capacitor dielectric; and access devices operably coupled to the DRAM capacitors.

13. The semiconductor device of claim 12, wherein an aspect ratio of the at least one DRAM capacitor is greater than about 20:1.

14. The semiconductor device of claim 12, wherein an aspect ratio of the at least one DRAM capacitor is from about 50:1 to about 100:1.

15. A system comprising:

a memory array comprising:

memory cells comprising DRAM capacitors and access devices operably coupled to the DRAM capacitors, at least one of the DRAM capacitors comprising:

a first capacitor electrode formed on a substrate, the first capacitor electrode comprising a lower portion neighboring the substrate and an upper portion disposed away from the substrate, the lower portion having a greater thickness than the upper portion along an entire length of the first capacitor electrode;

a capacitor dielectric adjacent to the first capacitor electrode; and a second capacitor electrode adjacent to the capacitor dielectric.

* * * * *